United States Patent
Bhaktavatson et al.

(10) Patent No.: US 8,542,049 B1
(45) Date of Patent: Sep. 24, 2013

(54) METHODS AND DELAY CIRCUITS FOR GENERATING A PLURALITY OF DELAYS IN DELAY LINES

(75) Inventors: Keshav Chintamani Bhaktavatson, Bangalore (IN); Nagalinga Swamy Basayya Aremallapur, Haveri (IN)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 13/450,088

(22) Filed: Apr. 18, 2012

(51) Int. Cl.
*H03H 11/26* (2006.01)
(52) U.S. Cl.
USPC ............ 327/276; 327/161; 327/278; 327/272
(58) Field of Classification Search
USPC ................. 327/269–272, 276–278, 161–163, 327/2–3, 12
See application file for complete search history.

(56) References Cited

U.S. PATENT DOCUMENTS 7,944,264 B2 * 5/2011 Nishiyama et al. ........... 327/276

* cited by examiner

*Primary Examiner* — An Luu
(74) *Attorney, Agent, or Firm* — John R. Pessetto; Wade J. Brady, III; Frederick J. Telecky, Jr.

(57) ABSTRACT

Various embodiments of a method of configuring a delay circuit for generating a plurality of delays in a delay line and a delay circuit configurable for generating plurality of delays are provided. The method includes determining, through a control circuit coupled with a delay line set, a first number of delay steps corresponding to an intrinsic delay of a delay line from among a plurality of delay lines of the delay line set. The intrinsic delay is a minimum delay contributed by the delay line. The method also includes determining, through the control circuit, a second number of delay steps to provide a delay through the delay line based on the first number of delay steps. The method further includes configuring, through a configuration circuit coupled with the delay line set, the delay line for generating the delay corresponding to the second number of delay steps through the delay line.

20 Claims, 6 Drawing Sheets

US 8,542,049 B1

METHODS AND DELAY CIRCUITS FOR GENERATING A PLURALITY OF DELAYS IN DELAY LINES

TECHNICAL FIELD

The present disclosure generally relates to methods and delay circuits.

BACKGROUND

In accordance with an exemplary scenario, a delay line set is capable of providing a fixed delay (e.g., a programmable delay) independent of voltage, temperature and/or process variations. The delay line set utilizes a reference (e.g., a reference clock) to calibrate and ensure the fixed delay. Some exemplary delay line sets include one or more delay lines connected or coupled with one another in series. Each of the delay lines from among a plurality of delay lines has an input and an output such that an input signal applied at an input node produces a delayed signal at the output of each delay of these delay lines. Each of the delay lines includes one or more delay paths. Each delay path from among a plurality of delay paths may include zero or more delay elements. Examples of the delay elements may include, for example, buffers, flip flops, logic gates, and the like. Each delay path from among a plurality of delay paths is configurable to produce a predetermined delay based on zero or more delay steps. Each delay path from among a plurality of delay paths provides an intrinsic delay corresponding to zero, or a minimum number of, delay steps. The intrinsic delay may be, for example, a minimum delay contributed by each delay path independent of a number of delay steps.

Moreover, an exemplary scenario provides that, in applications such as de-skewing, clock-centering, and clock balancing, the fixed delays are configured or implemented to ensure maximized margins. Some exemplary delay lines can be configured to provide a fixed delay of either $1/4^{th}$ or $1/5^{th}$ of a reference clock period by modeling the clock period in four or five delay elements, respectively. However, in applications such as de-skewing in circuits, fixed delays that are different than $1/4^{th}$ or $1/5^{th}$ the reference clock period may be implemented. In some exemplary scenarios, the above-mentioned issues may be mitigated by using computer-implemented techniques to configure each delay line so as to produce a plurality of delays that are different than $1/4^{th}$ or $1/5^{th}$ the reference clock period. However, such computer-implemented techniques may involve a significant amount of computationally intensive data processing, software and hardware support. Moreover, such computer-implemented techniques may also involve engaging a dedicated processor for the above-mentioned purposes.

SUMMARY

A number of exemplary methods and delay circuits for generating a plurality of delays in delay lines are disclosed herein. In an embodiment, a method includes determining, through a control circuit coupled with a delay line set, a first number of delay steps corresponding to an intrinsic delay of a delay line from among a plurality of delay lines of the delay line set. The intrinsic delay is a minimum delay contributed by the delay line. In an embodiment, a number of delay steps are determined or selected to provide a first delay by calibrating the delay line for the first delay. Furthermore, a number of delay steps are determined or selected to provide a second delay equivalent to a difference between the first delay and the intrinsic delay of each delay line by calibrating the delay line for the second delay.

The first number of delay steps corresponding to the intrinsic delay is computed based on the number of delay steps corresponding to the first delay, the number of delay steps corresponding to the second delay, and a ratio of the first delay and the second delay. In one embodiment, the first number of delay steps is tracked to the intrinsic delay of the delay line at a process node. The intrinsic delay is mapped to the first number of delays steps. The intrinsic delay is hard-coded as the tracked first number of delays steps. In an embodiment, a second number of delay steps to provide a delay through the delay line is determined, through the control circuit, based on the first number of delay steps. The delay may be a fraction or a multiple of a clock signal. The delay line is configured through a configuration circuit coupled with the delay line set, for generating the delay corresponding to the second number of delay steps through the delay line. Additionally, the delay generated through the delay line is scaled, and the scaled delay is provided to a plurality of slave delay lines. Different scaling factors are utilized to provide different delays to the plurality of slave delay lines, thereby allowing the utilization of a single delay line (or one or a group of components utilizing the single delay line) to function as a master for the plurality of slave delay lines.

Additionally, in an embodiment, a delay circuit includes a delay line set, a constant delay block, a control circuit, and a configuration circuit. The delay line set includes a plurality of delay lines, wherein each of the plurality of delay lines is configured to receive a clock signal and provide a plurality of delays, and wherein the delay line set includes an input terminal and an output terminal. The constant delay block is communicatively associated or coupled with the input terminal of the delay line set and is configured to delay the clock signal by an intrinsic delay of the plurality of delay lines. The constant delay block is a replication of the intrinsic delay of the plurality of delay lines. The control circuit is communicatively associated or coupled with the delay line set so as to be positioned or configured to determine a first number of delay steps corresponding to the intrinsic delay of each of the plurality of delay lines. The control circuit is also configured to determine a second number of delay steps based on the first number of delay steps so as to provide the plurality of delays through each of the plurality of delay lines. The configuration circuit is communicatively associated or coupled with the constant delay block and the delay line set so as to be positioned or configured to configure each of the plurality of delay lines to generate the plurality of delays based on the number of steps.

Moreover, in an embodiment, a delay circuit includes a delay line set, a control circuit, and a configuration circuit. The delay line set includes a plurality of delay lines, wherein each of the plurality of delay lines are configured to provide a plurality of delays. The delay line set includes an input terminal configured to receive a clock signal and an output terminal configured to provide a delayed signal. The control circuit is communicatively associated or coupled with the delay line set so as to be positioned or configured to determine a first number of delay steps corresponding to an intrinsic delay of the delay line set and determine a second number of delay steps based on the first number of delay steps so as to provide the plurality of delays through each of the plurality of delay lines. The configuration circuit is communicatively associated or coupled with the delay line set so as to be positioned or configured to configure each of the plurality of delay lines to generate the plurality of delays based on the number of steps.

DETAILED DESCRIPTION

Pursuant to an exemplary scenario, a configurable delay circuit includes one or more delay lines connected or coupled with one another in series. Each of the delay lines from among a plurality of delay lines has an input and an output such that an input signal applied at an input node produces a plurality of delayed signals at the output of each the delay lines. The delay of each delay line from among a plurality of delay lines can be adjusted so as to produce a predetermined delay.

Figure 1:
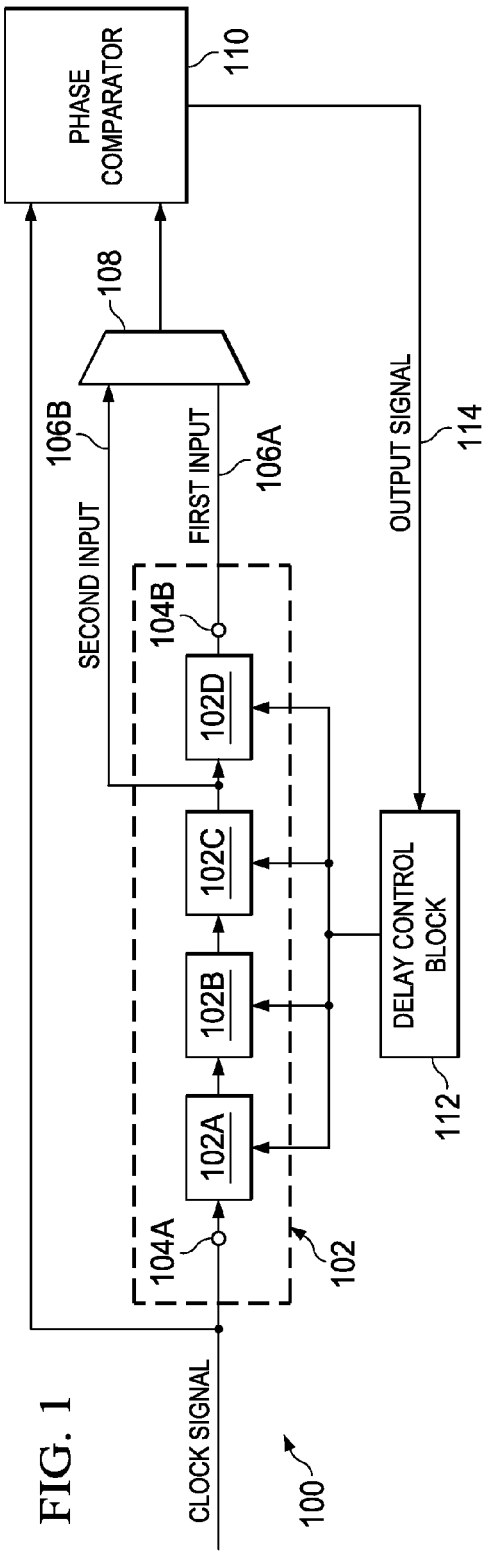
FIG. 1 is an exemplary configurable delay circuit according to an exemplary scenario.

FIG. 1 is an exemplary configurable delay circuit 100 according to an exemplary scenario. As illustrated in FIG. 1, the configurable delay circuit 100 includes a delay line set 102 including a plurality of delay lines 102A-102D connected or coupled with one another in series. The delay line set 102 receives a clock signal at an input terminal 104A and outputs a delayed signal at an output terminal 104B. The delay line set 102 is communicatively associated or coupled with a selection circuit 108. The delayed signal from output terminal 104B of the delay line set 102 is fed to the selection circuit 108 as a first input 106A, and an output of a delay line 102C is fed as a second input 106B to the selection circuit 108. The selection circuit 108 selects one of the first input 106A or the second input 106B and outputs the selected first input 106A or the selected second input 106B to a phase comparator 110. The phase comparator 110 is configured to determine a phase difference between the output (e.g., the first input 106A or the second input 106B) of the selection circuit 108 and the clock signal.

The phase comparator 110 compares the phase of the clock signal to the phase of a delayed signal (e.g., the first input 106A or the second input 106B) received from the selection circuit 108 in order to determine the phase difference. The phase comparator 110 synchronizes the phase of the delayed signal to the phase of the clock signal. In an embodiment, the phase comparator 110 generates a first signal if the phase difference is equal to or greater than a first predetermined phase difference indicative of the delayed signal leading the clock signal by more than the first predetermined phase difference. In an embodiment, the phase comparator 110 generates a second signal if the phase difference is equal to or less than a second predetermined phase difference indicative of the delayed signal lagging behind the clock signal by more than the second predetermined phase difference. The phase comparator 110 is communicatively associated or coupled with a delay control block 112. An output 114 (e.g. the first signal or the second signal) of the phase comparator 110 is routed so as to be an input to the delay control block 112.

The delay control block 112 is configured to calibrate the delay lines (102A-102D) to produce a delay equivalent to one third ($\frac{1}{3}^{rd}$) or one fourth ($\frac{1}{4}^{th}$) of the clock period of the clock signal based on the output 114 of the phase comparator 110. An example of the delay control block 112 includes an up/down counter. In an embodiment, the delay control block 112 responds to the first signal by increasing the delay of each of the delay lines (102A-102D) in order to reduce the phase difference. In one embodiment, however, the delay control block 112 responds to the second signal by decreasing the delay of each of the delay lines (102A-102D) in order to reduce the phase difference. The phase comparator 110 generates neither the first signal nor the second signal if the phase difference is between the first predetermined phase difference and the second predetermined phase difference. The delay control block 112 controls the delay of the delay lines (102A-102D) based on the phase difference so as to calibrate each of the delay lines (102A-102D) to provide the delay of $\frac{1}{3}^{rd}$ or $\frac{1}{4}^{th}$ of the clock period.

The delay of $\frac{1}{3}^{rd}$ or $\frac{1}{4}^{th}$ of the clock period of each of the delay lines (102A-102D) may be provided to a slave delay line. In certain applications, such as de-skewing in electronic circuits, the utilization of delay values other than $\frac{1}{3}^{th}$ or $\frac{1}{4}^{th}$ of the clock period may be implemented. However, pursuant to one exemplary implementation, the delay circuit 100 does not enable the configuring of the delay lines (102A-102D) of the delay line set 102 to provide delays that are different than $\frac{1}{3}^{rd}$ or $\frac{1}{4}^{th}$ of the clock period without the addition of one or more delay lines (e.g., to provide a higher delay), or the removal of one or more delay lines (e.g., to provide a lower delay), used in the delay line set 102 (such that a compromise on the area of the chip may be realized) or without changing the size of one or more of the delay elements that are implemented. In an embodiment, each of the delay lines (102A-102D) includes one or more delay elements. The delay elements are programmable through one or more delay steps so as to provide a predetermined delay.

Figure 2:
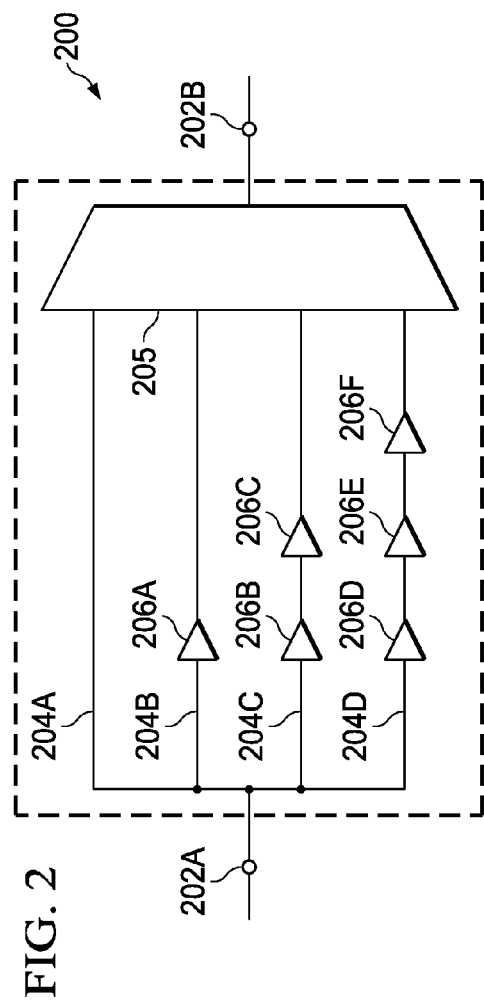
FIG. 2 illustrates an exemplary delay line according to an exemplary scenario.

FIG. 2 illustrates an exemplary delay line 200 according to an exemplary scenario. The delay line 200 includes an input terminal 202A and an output terminal 202B. The delay line 200 includes a set of four delay paths 204A-204D that are configurable to provide four different delays, respectively. The delay line also includes a selection circuit 205. In an embodiment, each of the four delay paths 204A-204D are communicatively associated or coupled with the selection circuit 205. The selection circuit 205 is configured to selectively route signals received from one or more of the four delay paths 204A-204D to the output terminal 202B. It is noted that delay paths 204B, 204C, and 204d include delay elements 206A-206F, and that the delay path 204A is devoid of a delay element. Examples of the delay elements may include, for example, buffers, flip flops, logic gates, and the like. Zero or more delay elements may be selectively included into each of the delay paths so as to adjust a total delay provided by each delay path from among the four delay paths. The four delay paths are representative of four adjustable delay steps of the delay line 200.

The delay line 200 can be configured to generate a set of four delays corresponding to the four delay steps. The delay provided by each of the four delay paths includes an intrinsic delay of the delay line 200 and a delay that is substantially equivalent to zero or more delay steps. Consider, for example, using a delay step of 20 picoseconds (ps) and an intrinsic delay of 100 ps, wherein the delay paths 204A, 204B, 204C, and 204D may be configured to provide delays of, for example, 100 ps, 120 ps, 140 ps and 160 ps, respectively. As the delay path 204A does not include a delay element, the delay path 204A provides a delay of 100 ps, which is equivalent to the intrinsic delay of the delay line 200. The intrinsic delay may be defined as a minimum delay contributed by each of the delay paths (204A-204D), which is independent of a number of delay steps.

The delay paths 204A, 204B, 204C, and 204D correspond to 0 delay steps, 1 delay step, 2 delay steps, and 3 delay steps respectively. On receiving 0 delay steps, the delay provided by the delay line 200 is 100 ps through the delay path 204A, which constitutes the intrinsic delay. The intrinsic delay of 100 ps maps to 5 delay steps. In the above example, if the delay line 200 is programmed for 2 steps, for a desired delay of 40 ps, the delay line 200 may provide 140 ps instead of 40 ps. Also, in the above example, as the intrinsic delay maps to 5 delay steps, if a delay of 160 ps is to be achieved (e.g., by mapping to 8 delay steps of 20 ps each), then the actual number of delay steps that are to be provided to the delay line 200 is 3 (e.g., 8 delay steps minus 5 delay steps). In order to provide the actual number of delay steps, the intrinsic delay is to be modeled in terms of delay steps. Furthermore, pursuant to one exemplary implementation, the delay line 200 provides a minimum delay of 100 ps, due to the intrinsic delay, and the delay line 200 cannot be utilized to provide a delay that is less than 100 ps.

It is noted that various embodiments of the present technology enable a granular configurability of delay lines through the modeling of an intrinsic delay of a delay line in terms of one or more delay steps. The delay line may be programmed to provide a delay from almost zero to a selected value, which may include, but is not limited to, a fraction or a multiple of a time period (e.g., a clock period) of a clock signal through a single calibration. Moreover, the various methods and delay circuits of a number of embodiments may be utilized for fine grain de-skewing and/or levelizing in circuits.

Figure 3:
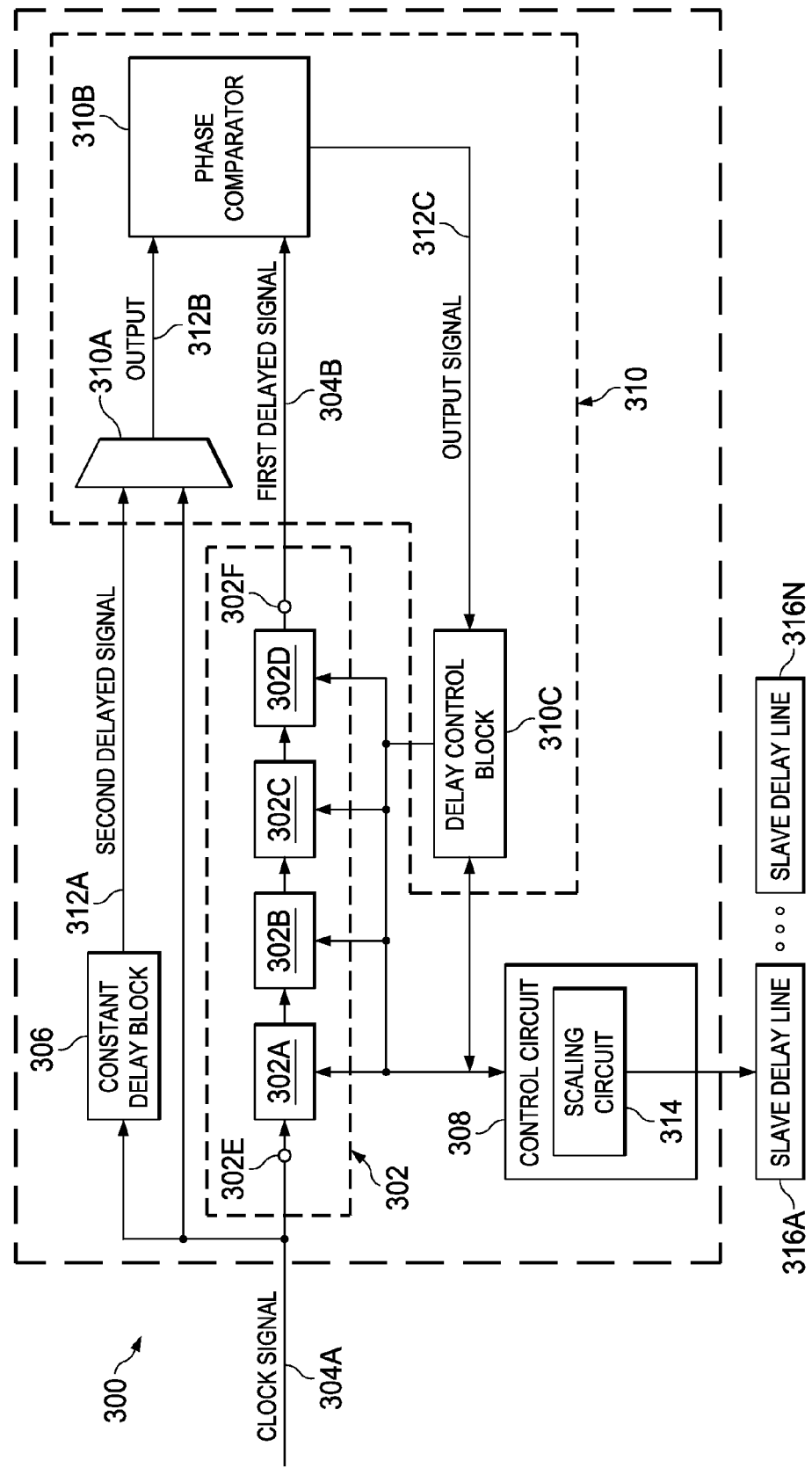
FIG. 3 is a block diagram illustrating a first exemplary delay circuit according to an embodiment.

According to an embodiment, a delay line from among a plurality of delay lines of a delay line set is configured to provide a plurality of delays through an initial calibration. FIG. 3 is a block diagram illustrating a first exemplary delay circuit 300 according to an embodiment. In an embodiment, the delay circuit 300 includes a delay line set 302. The delay line set 302 includes a plurality of delay lines, such as, for example, 302A, 302B, 302C, and 302D. Each of the delay lines (302A-302D) is configured to provide a plurality of delays. Each of the delay lines (302A-302D) includes one or more delay elements (e.g., delay elements 206A-206F of FIG. 2) that are configurable through a plurality of delay steps such that the plurality of delays may be provided through each delay lines (302A-302D). The delay steps include, for example, fine delay steps. The delay line set 302 includes an input terminal 302E and an output terminal 302F. The delay line set 302 receives a clock signal 304A at the input terminal 302E and outputs a first delayed signal 304B at the output terminal 302F.

The delay circuit 300 also includes a constant delay block 306, a control circuit 308, and a configuration circuit 310. The constant delay block 306 is communicatively associated or coupled with the input terminal 302E of the delay line set 302. The constant delay block 306 is configured to delay a clock signal 304A by the intrinsic delay of the delay lines (302A-302D). The constant delay block 306 provides a replication of an intrinsic delay of the delay lines (302A-302D). For example, if the delay line set 302 includes four delay lines, the constant delay block 306 may be configured to provide a delay equivalent to four times the intrinsic delay (e.g., if the intrinsic delay is D, the constant delay block 306 generates a delay of 4×D) of each of the delay lines (302A-302D). In an embodiment, the constant delay block 306 includes one or more delay lines configured to generate the intrinsic delay of the delay lines (302A-302D). In an embodiment, the one or more delay lines of the constant delay block 306 are configured to generate the intrinsic delay of the delay lines (302A-302D) upon receiving a zero or a minimum number of delay steps. In an embodiment, the control circuit 308 is communicatively associated or coupled with the delay line set 302 so as to be positioned or configured to determine the first number of delay steps corresponding to the intrinsic delay of each of the delay lines (302A-302D).

In an embodiment, the control circuit 308 may embodied as an application specific integrated circuit (ASIC) or a field programmable gate array (FPGA) specifically configured to perform a number of the operations, or a combination thereof, of the control circuit 308, as described herein. In an embodiment, the control circuit 308 may also include memory devices (e.g., a cache), timing devices (e.g., a real-time clock (RTC)), an array of configurable logic blocks (CLBs), an array of programmable input/output blocks (IOBs) and/or additional circuitry or data transmission channels. In an embodiment, the CLBs and IOBs may be interconnected or coupled with one another by a programmable interconnect structure. In an embodiment, the control circuit 308 may be programmed by loading a stream of configuration data (e.g., a bit-stream) into internal configuration memory cells associated with the memory devices, wherein this configuration data may include definitions of various configurations. The configuration data may also be read from an external memory (e.g., a programmable read only memory (PROM)) or written into the FPGA by an external device. The collective states of the individual memory cells then determine the function of the FPGA.

The control circuit 308 is configured to determine a second number of delay steps based on the first number of delay steps (corresponding to the intrinsic delay) so as to provide the a delay corresponding to the second number of delay steps through each of the delay lines (302A-302D). Consider the example where the intrinsic delay of a delay line is 100 ps. If the step size is 20 ps, the intrinsic delay of the delay line corresponds to 5 delay steps. If a delay of 160 ps is to be achieved, the delay corresponds to 8 delay steps. Considering that the intrinsic delay maps to 5 delay steps, an actual number of delay steps to be implemented in order to achieve the delay of 160 ps is a difference of 8 and 5 delay steps (for example, 3 delay steps). The control circuit 308 determines that the intrinsic delay maps to 5 delay steps, and, based on that, the control circuit 308 determines that 3 delay steps can be provided to the delay lines in order to achieve the 160 ps delay through each of the delay lines. In an embodiment, the control circuit 308 may be communicatively associated with or coupled with a scaling circuit 314 configured to scale each of the plurality of delays generated through the delay line set 302 by scaling the second number of delay steps and providing the scaled delays to a plurality of slave delay lines (316A-316N). The scaling may be different for each of the slave delay lines (316A-316N). For the purpose of illustration the scaling circuit 314 is shown to be within the control circuit 308, however several embodiments provide that the scaling circuit 314 may be external to the control circuit 308.

In an embodiment, the configuration circuit 310 is communicatively associated or coupled with the constant delay block 306 and the delay line set 302. The configuration circuit 310 is operable to configure each of the delay lines (302A-302D) to generate the plurality of delays based on the second number of delay steps. The configuration circuit 310 also enables the control circuit 308 to determine the number of steps that are to be implemented to provide the plurality of delays through each of the delay lines (302A-302D). The configuration circuit 310 includes a selection circuit 310A, a phase comparator 310B, and a delay control block 310C. The selection circuit 310A is configured to provide one of the clock signal 304A and a second delayed clock signal 312A from the constant delay block 306 as an output 312B of the selection circuit 310A. The second delayed clock signal 312A may include a signal that is substantially equivalent to the clock signal 304A delayed by an intrinsic delay of the delay lines (302A-302D) through the constant delay block 306. It is noted that the selection circuit 310A may include, for example, a multiplexer.

The phase comparator 310B is communicatively associated or coupled with the selection circuit 310a and the delay line set 302. The phase comparator 310B receives the output 312B of selection circuit 310A and the first delayed signal 304B from the output terminal 302F of the delay line set 302. The phase comparator 310B is configured to determine a phase difference between the output 312B of the selection circuit 310A and the first delayed signal 304B. In an embodiment, the phase comparator 310B generates a first signal if the phase difference is equal to or greater than a first predetermined phase difference indicative of the first delayed signal 304B leading the output 312B of the selection circuit 310A by more than the first predetermined phase difference.

In an embodiment, the phase comparator 310B generates a second signal if the phase difference is equal to or less than a second predetermined phase difference indicative of the first delayed signal 304B lagging behind the output 312B of the selection circuit 310A by more than the second predetermined phase difference. The phase comparator 310B does not generate the first signal and the second signal if the phase difference is between the first predetermined phase difference and the second predetermined phase difference. In an embodiment, the phase comparator 310B may generate a third signal that is different than the first signal and the second signal, and which is indicative of the phase difference between the first and second predetermined phase differences.

The phase comparator 310B is communicatively associated or coupled with a delay control block 310C. An output signal 312C (e.g. the first signal or the second signal) of the phase comparator 310B is routed so as to be an input to the delay control block 310C. The delay control block 310C is operable to control the plurality of delays generated through the delay lines (302A-302D) based on the output signal 312C of the phase comparator 310B. The delay control block 310C may include, for example, an up/down counter. In an embodiment, the delay control block 310C responds to the first signal by increasing the delay of each of the delay lines (302A-302D) so as to reduce the phase difference.

In one embodiment, however, the delay control block 310C responds to the second signal by decreasing the delay of each of the delay lines (302A-302D) in order to reduce the phase difference. In an embodiment, by increasing or decreasing the delay of the delay lines (302A-302D), the delay control block 310C calibrates each of the delay lines (302A-302D) so as to provide a delay of, for example, $\frac{1}{4}^{th}$ of the clock period associated with the clock signal, $\frac{1}{6}^{th}$ of the clock period, $\frac{3}{4}^{th}$ of the clock period, twice the clock period, and the like. In an embodiment, the control circuit 308 is operatively associated or coupled with the delay control block 310C. The control circuit 308 is configured to model the intrinsic delay of the delay lines (302A-302D) in terms of the first number of delay steps based on the calibration of the delay lines (302A-302D) through the delay control block 310C.

In an embodiment, the control circuit 308 is configured to determine a number of delay steps configured or selected to provide a first delay (e.g., $\frac{1}{4}^{th}$ of the clock period of the clock signal, $\frac{1}{6}^{th}$ of the clock period, twice the clock period, and the like) through each of the delay lines. The number of delay steps corresponding to the first delay is determined by calibrating the delay lines (302A-302D) (e.g., by the delay control block 310C) to provide the first delay. The control circuit 308 is also configured to determine a number of delay steps configured or selected to provide a second delay through each of the delay lines (302A-302D), wherein the second delay is equivalent to a difference between the first delay and the intrinsic delay of each of the delay lines (302A-302D) (e.g., $\frac{1}{4}^{th}$ the clock period–D, $\frac{1}{6}^{th}$ of the clock period–D, twice the clock period–D, wherein "D" is the intrinsic delay of the delay line). Additionally, the control circuit 308 is also configured to compute first number of delay steps corresponding to the intrinsic delay of each of the delay lines (302A-302D) based on the number of delay steps corresponding to the first delay and the number of delay steps corresponding to the second delay.

For example, the control circuit 308 computes a difference between the number of delay steps corresponding to the first delay and the number of delay steps corresponding to the second delay. The difference maps to the first number of steps corresponding to the intrinsic delay of each of the delay lines (302A-302D) (e.g., difference=$\frac{1}{4}$ of the clock period–($\frac{1}{4}$ of the clock period–D)). In an embodiment, the control circuit 308 is configured to determine a second number of delay steps delay steps configured or selected to provide a delay through each of the delay lines (302A-302D) based on the first number of delay steps corresponding to the intrinsic delay of each of the delay lines (302A-302D).

In an example, if a delay of 160 ps is to be generated through a delay line with an intrinsic delay of 100 ps, and a step size of 20 ps is used, in so much as the intrinsic delay (as equal to 100 ps) maps to 5 delay steps, the control circuit 308 computes 5 delay steps corresponding to the intrinsic delay. The number of delay steps corresponding to 160 ps is 8 delay steps based on 20 ps steps. The control circuit 308 determines 3 delay steps (e.g., 8–5) as the number of steps corresponding to the 160 ps of delay to be generated. The control circuit 308 transmits the number of delay steps (for example, 3) to the delay control block 310c such that delay control block 310c may configure each of the delay lines (302A-302D) to provide the delay of 160 ps. When a predetermined delay is to be generated through a delay line, a suitable number of delay steps is provided through the delay control block 310c. First number of delay steps corresponding to the intrinsic delay (e.g., 5 delay steps in the example described above) are added (e.g., by using the control circuit 308) to a number of delay steps (e.g., 3 delay steps) so as to obtain a sum (e.g., 8 delay steps). The sum (e.g., 8 delay steps) is scaled based on the predetermined delay to obtain a scaled delay, and the first number of delay steps corresponding to the intrinsic delay are subtracted from the scaled delay in order to obtain the suitable number of delay steps corresponding to the predetermined delay.

Based on the suitable number of delay steps, a plurality of delays may be generated through each of the delay lines (302A-302D) based on a calibration (such as explained above) through the delay control block 310C. Accordingly, the delay lines (302A-302D) may be configured to provide a delay from almost zero to a selected value (e.g., a multiple of the clock period) based on the calibration, and the delay circuit 300 thereby enables a granular configurability of the delay lines by taking into account the intrinsic delay. The delay control block 310C controls the plurality of delays generated through each of the delay lines (302A-302D). In an embodiment, each of the plurality of delays from each of the delay lines (302A-302D) may be provided to the slave delay lines (316A-316N). The plurality of delays generated through each of the delay lines may be scaled and applied to each of the slave delay lines (316A-316N) by scaling the number of delay steps. The scaling may be different for different slave delay lines, thereby allowing each of the delay lines (302A-302D) to be utilized as a master for multiple slave delay lines. The plurality of delays generated through each of the delay lines (302A-302D) may be independent of the clock period.

Figure 4:
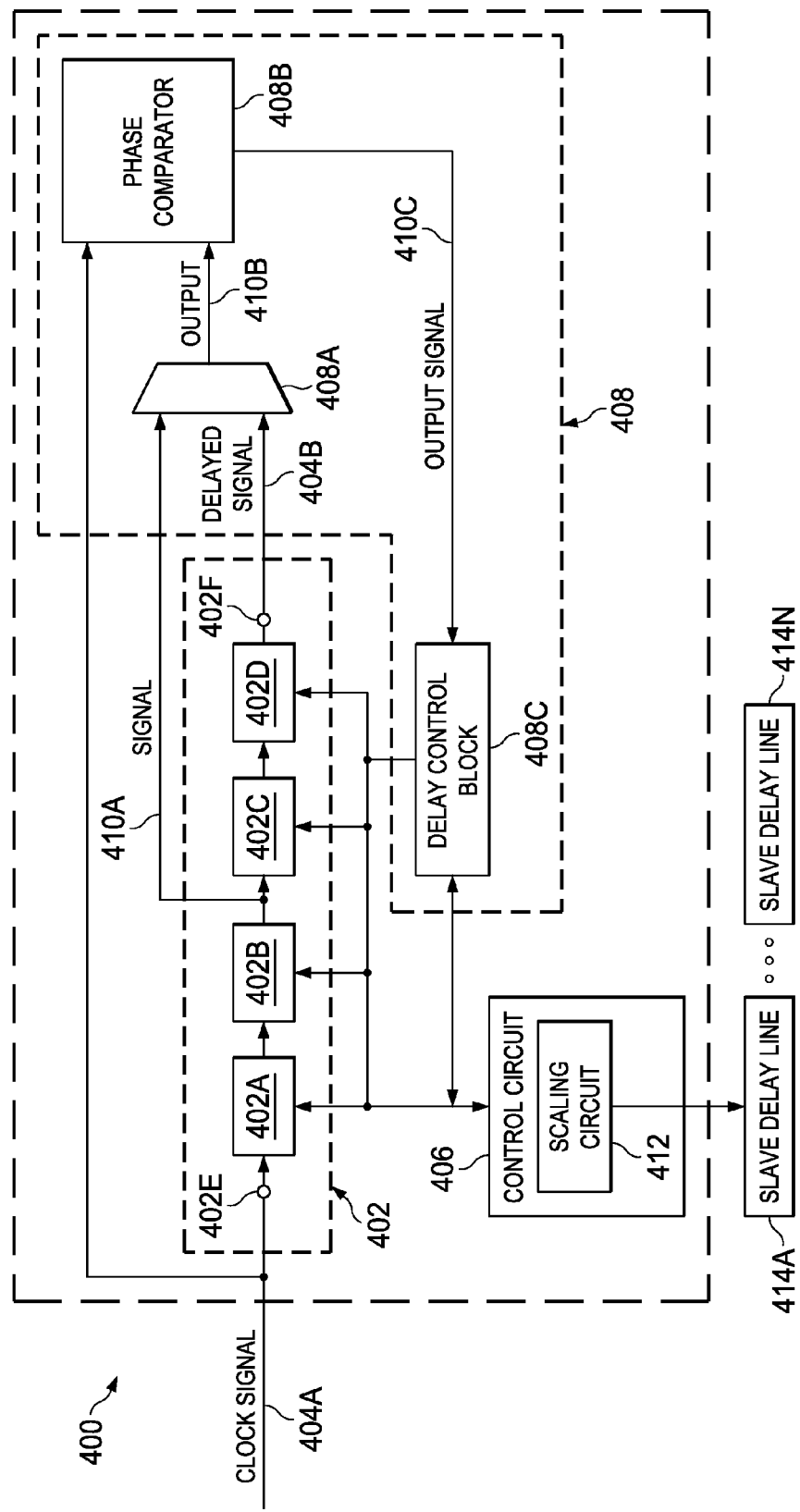
FIG. 4 is a block diagram illustrating a second exemplary delay circuit according to an embodiment.

FIG. 4 is a block diagram illustrating a second exemplary delay circuit 400 according to an embodiment. In an embodiment, the delay circuit 400 includes a delay line set 402. The delay line set 402 includes a plurality of delay lines, such as, for example, 402A, 402B, 402C, and 402D. In an embodiment, each of the delay lines (402A-402D) is configured to provide a plurality of delays. In an embodiment, each of delay lines (402A-402D) may include first delay lines (e.g., delay line 200 of FIG. 2) that are configurable, through a plurality of delay steps, to provide the plurality of delays. The delay steps may be, for example, fine delay steps. The delay line set 402 includes an input terminal 402E and an output terminal 402F. In an embodiment, a clock signal 404A is applied at the input terminal 402E and a delayed signal 404B is generated at the output terminal 402F. The delay circuit 400 additionally includes a control circuit 406 and a configuration circuit 408. The control circuit 406 is communicatively associated or coupled with the delay line set 402 so as to be positioned or configured to determine first number of delay steps corresponding to an intrinsic delay of the delay line set 402.

In an embodiment, the control circuit 406 may be a processing block similar to the control circuit 308 explained with reference to FIG. 3. In an embodiment, the control circuit 406 is an example of the control circuit 308 and is configured to determine a second number of delay steps based on the first number of delay steps so as to provide a delay corresponding to the second number of delay steps through each of the delay lines (402A-402D). In an embodiment, the control circuit 406 is configured to determine a number of delay steps configured or selected to provide a first delay through each of the delay lines (402A-402D) of the delay line set 402. In an embodiment, the first delay may be a fraction or multiple of the clock period of the clock signal (e.g., $\frac{1}{4}^{th}$ the clock period of the clock signal, $\frac{1}{6}^{th}$ the clock period of the clock signal, three times the clock period of the clock signal, and the like). The control circuit 406 is also configured to determine a number of delay steps configured or selected to provide a second delay through each of the delay lines (402A-402D). The second delay may be different than the first delay. In an embodiment, the second delay may be a fraction or multiple of the clock period of the clock signal (e.g., ½ of the clock period, $\frac{1}{8}^{th}$ of the clock period of the clock signal, and the like). The control circuit 406 is configured to determine the first number of delay steps corresponding to the intrinsic delay based on the number of delay steps corresponding to the first delay and the number of delay steps corresponding to the second delay.

For example, if the first delay is $\frac{1}{4}^{th}$ of the clock period and the second delay is half of the clock period, in so much as half of the clock period (or (clock period)/2) is twice as much as $\frac{1}{4}^{th}$ the clock period (or (clock period)/4), the number of delay steps corresponding to ½ of the clock period is twice the number of delay steps corresponding to $\frac{1}{4}^{th}$ of the clock period. The control circuit 406 compares the number of delay steps corresponding to the first delay with the number of delay steps corresponding to the second delay based on a ratio of the first delay and the second delay (wherein first delay=½× second delay, and wherein the number of delay steps of the first delay=½×number of delay steps of the second delay). The comparison yields first number of delay steps corresponding to the intrinsic delay.

The configuration circuit 408 is communicatively associated or coupled with the delay line set 402 so as to be positioned or configured to configure each of the delay lines (402A-402D) to generate the plurality of delays. The configuration circuit 408 configures each of the delay lines (402A-402D) to generate a delay corresponding to the second number of delay steps. The delay may include, for example, a delay of ½ of the clock period, a delay of ¼ of the clock period, three times the clock period, and the like. The configuration circuit 408 includes a selection circuit 408A, a phase comparator 408B, and a delay control block 408C. In an embodiment, the selection circuit 408A is communicatively associated or coupled with the delay line set 402. The selection circuit 408A is configured to provide the delayed signal 404B, or a signal 410A generated by delaying the clock signal 404A through a portion of the delay line set 402 including one or more delay lines (e.g., the delay lines 402A and 402B as illustrated in FIG. 4), as an output 410B of the selection circuit 408A. It is noted that the selection circuit 408A may include, for example, a multiplexer.

The phase comparator 408B is configured to determine a phase difference between the output 410B of the selection circuit 408A and the clock signal 404A. The phase comparator 408B generates an output signal 410C based on the phase difference. The output signal 410C of the phase comparator 408B is routed so as to be an input of the delay control block 408C. The delay control block 408C is communicatively associated or coupled with the delay line set 402 and the phase comparator 408B so as to calibrate the delay lines (402A-402D) and control the plurality of delays generated through each of the delay lines (402A-402D) based on the phase difference. It is noted that the delay control block 408C may include, for example, an up/down counter. In an embodiment, the control circuit 406 is operatively associated or coupled with the delay control block 408C. The control circuit 406 is configured to model the intrinsic delay of the delay line in terms of first number of delay steps based on the calibration of the delay lines through the delay control block 408C.

In an embodiment, the configuration circuit 408 operates through a two step comparison process for modelling the intrinsic delay of the delay lines (402A-402D). During a first comparison, the phase comparator 408B compares the clock signal 404A with the signal 410A so as to determine a phase difference between the clock signal 404A and the signal 410A that includes the clock signal 404A delayed by the delay lines 402A and 402B in series. In an embodiment, the phase comparator 408B generates a first signal if the phase difference is equal to or greater than a first predetermined phase difference indicative of the signal 410A leading the clock signal 404A by more than the first predetermined phase difference. In an embodiment, the phase comparator 408B generates a second signal if the phase difference is equal to or less than a second predetermined phase difference indicative of the signal 410A lagging behind the clock signal 404A by more than the second predetermined phase difference. The phase comparator 408B does not generate any of the first signal or the second signal if the phase difference is between the first predetermined phase difference and the second predetermined phase difference. In an embodiment, the phase comparator 408B may generate a third signal that is different than the first signal and the second signal and indicative of the phase difference between the first and second predetermined phase differences.

The delay control block 408C responds to the first signal by increasing the delay of each of the delay lines (402A-402D) in order to reduce the phase difference. In one embodiment, however, the delay control block 408C responds to the second signal by decreasing the delay of each of the delay lines (402A-402D) in order to reduce the phase difference. In an embodiment, by increasing or decreasing the delay of the delay lines (402A-402D) during the first comparison, the delay control block 408C calibrates each of the delay lines (402A-402D) in order to provide a delay of ½ of the clock period of the clock signal 408F. The control circuit 406 determines the number of delay steps corresponding to ½ of the clock period delay of the delay lines (402A-402D).

During a second comparison, the phase comparator 408B determines a phase difference between the clock signal 404A and the delayed signal 404B that includes the clock signal 404A delayed by the delay lines 402A, 402B, 402C, and 402D. The delay control block 408C configures each of the delay lines (402A-402D) to provide a delay of ¼$^{th}$ of the clock period. The control circuit 406 determines the number of delay steps corresponding ¼$^{th}$ of the clock period delay of the delay lines. The control circuit 406 compares the number of delay steps corresponding to ½ of the clock period delay with the number of delay steps corresponding to the ¼$^{th}$ of the clock period delay based on a ratio of the first delay (½ of the clock period delay) and the second delay (¼$^{th}$ of the clock period delay) in order to arrive at a linear equation. The control circuit 406 computes a solution to the linear equation so as to determine the one or more steps corresponding to the intrinsic delay. The first delay and the second delay may be selected by using a suitable number of delay lines from among the plurality of delay lines (402A-402D) to generate the signal 410A and the delayed signal 404B. In an embodiment, the first delay and the second delay may be a fraction or a multiple of the clock period of the clock signal 404A, such as, for example, ⅙$^{th}$ of the clock period, 3×the clock period, and the like.

In an embodiment, the control circuit 406 transmits the number of delay steps to the delay control block 408C so as to configure each of the delay lines (402A-402D) to provide the delay corresponding to the number of delay steps. When a predetermined delay is to be generated through each of the delay lines (402A-402D), a suitable number of delay steps is provided through the delay control block 408C. The first number of delay steps corresponding to the intrinsic delay is added (e.g., by using the control circuit 406) to a number of delay steps to obtain a sum. The sum is scaled based on the predetermined delay so as to obtain a scaled delay, and the first number of delay steps corresponding to the intrinsic delay are subtracted from the scaled delay so as to obtain the suitable number of delay steps corresponding to the predetermined delay. Based on the suitable number of delay steps, a plurality of delays may be generated through each of the delay lines (402A-402D) based on a single calibration (as explained above) through the delay control block 408C. The delay lines (402A-402D) may be configured to provide a delay from almost zero to any selected value (e.g., a multiple of the clock period) based on the calibration, and the delay circuit 400 thereby enables a granular configurability of the delay lines (402A-402D) in terms of delay steps by taking into account a number of steps corresponding to the intrinsic delay.

The delay control block 408C controls the plurality of delays generated through each of the delay lines (402A-402D). In an embodiment, the control circuit 406 includes a scaling circuit 412 configured to (1) scale each of the plurality of delays generated through each of the of delay lines (402A-402D) by scaling a number of delay steps and (2) provide the scaled delay to a plurality of slave delay lines (414A-414N). The plurality of delays generated through each of the delay lines (402A-402D) may be scaled and applied to each of the slave delay lines (414A-414N). The scaling may be different for different slave delay lines, thereby allowing each of the delay lines (402A-402D) to be utilized as a master for multiple slave delay lines. The plurality of delays generated through each of the delay lines (402A-402D) may be independent of the clock period. Various embodiments of the present technology enable the mapping of an almost zero delay with a zero delay step value in a code so as to configure the delay line as explained herein with reference to FIG. 5.

Figure 5:
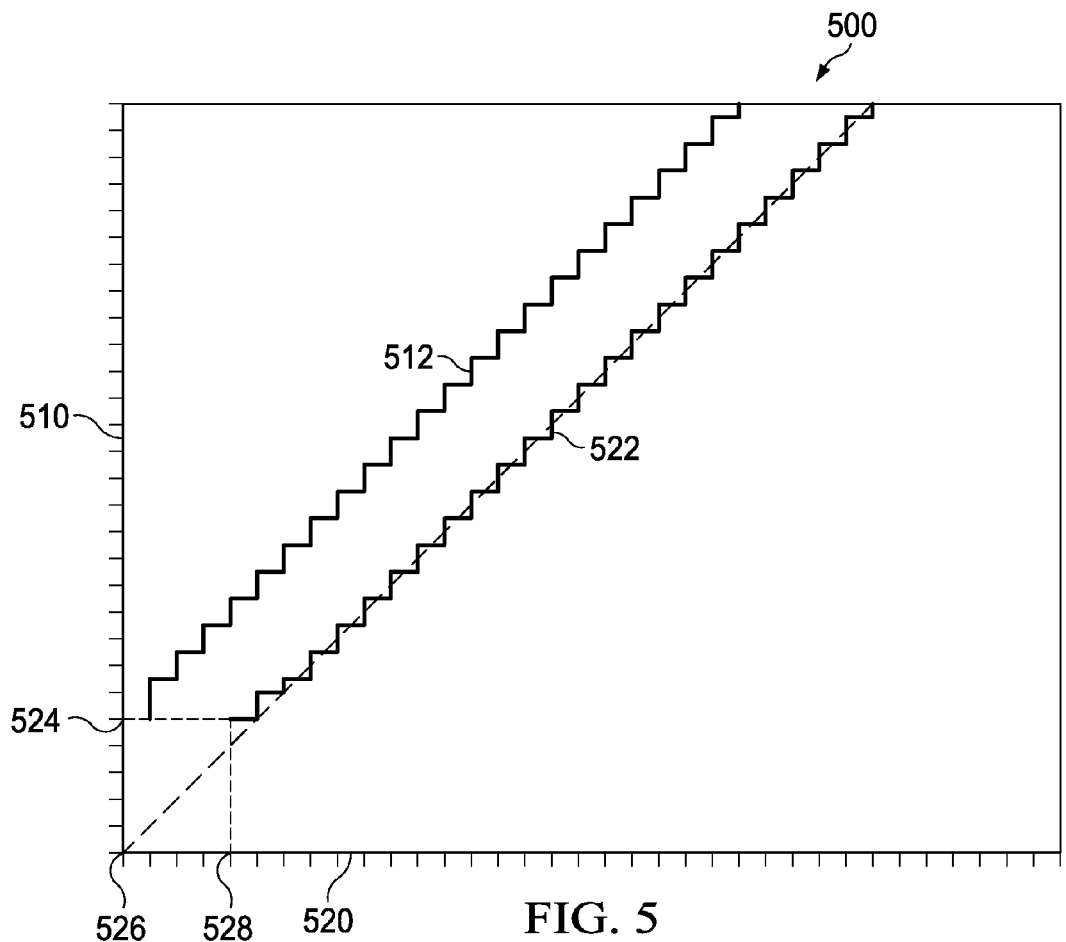
FIG. 5 is an exemplary graph illustrating an exemplary granular configurability of the delay circuits of FIG. 3 and FIG. 4 according to an embodiment.

FIG. 5 is an exemplary graph illustrating an exemplary granular configurability of the delay circuit 300 of FIG. 3 and the delay circuit 400 of FIG. 4 according to an embodiment. FIG. 5 is a graph 500 representing a delay 510 (e.g., a temporal delay measurable in picoseconds (ps)) generated through a delay line (along a vertical or y-axis) with respect to a code 520 in terms of delay steps for the delay 510 (along a horizontal or x-axis). The graph 500 includes a first plot 512 corresponding to a code corresponding to the delay of the delay line where the intrinsic delay of the delay line is not taken into account while configuring the delay lines in terms of delay steps. The graph 500 also includes a second plot 522 corresponding to a code to the delay line with compensation for the intrinsic delay of the delay line in accordance with an embodiment. The compensation of the intrinsic delay of the delay line enables a granular configurability of the delay line to be achieved. As illustrated in FIG. 5, the delay line of the first plot 512 provides a delay of, for example, 100 ps (See, 524) at 0 delay steps of the code to the delay line. On the contrary, the delay line of the second plot 522 provides almost 0 ps of delay for 0 delay steps (See, 526) and 100 ps of delay for 5 delay steps (See, 528) thereby indicating that the delay circuit enables a granular configurability of the delay line from almost zero to a selected delay value once compensated for the intrinsic delay with a single calibration.

Figure 6:
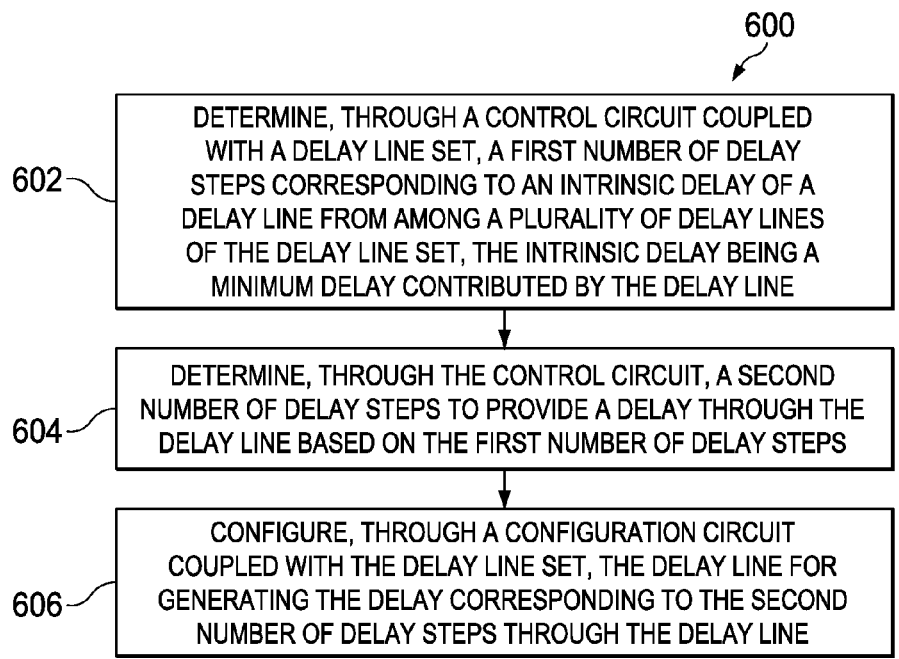
FIG. 6 is a flow chart of an exemplary method of for generating a plurality of delays in a delay line according to an embodiment.

FIG. 6 is a flow chart 600 of an exemplary method of generating a plurality of delays in a delay line according to an embodiment. The delay line may be a component of a delay line set including a plurality of delay lines. As illustrated in FIG. 6, in operation 602, a first number of delay steps corresponding to an intrinsic delay of the delay line are determined, through a control circuit (e.g., control circuit 308 of FIG. 3 or control circuit 406 of FIG. 4) coupled with the delay line set. In an embodiment, a number of delay steps configured or selected to provide a first delay is determined (e.g., by using control circuit 308 of FIG. 3 or control circuit 406 of FIG. 4) by calibrating (e.g., by using the delay control block 310c of FIG. 3 or the delay control block 408C of FIG. 4) the delay line for the first delay. For example, if the delay line set includes four delay lines, each delay line is calibrated to provide a first delay equivalent to $\frac{1}{4}^{th}$ of a clock period of a clock signal input to the delay line set. Furthermore, a number of delay steps configured or selected to provide a second delay equivalent to a difference between the first delay and the intrinsic delay of each delay line (e.g., $\frac{1}{4}^{th}$ of the clock period–D, with D being the intrinsic delay of the delay line) is determined (e.g., by using the control circuit 308 of FIG. 3 or the control circuit 406 of FIG. 4) by calibrating (e.g., by using the delay control block 310c of FIG. 3 or the delay control block 408C of FIG. 4) the delay line for the second delay. During calibration, the clock signal is delayed by the intrinsic delay of the delay line.

The clock signal is delayed by replicating a constant intrinsic path of the delay line. For example, if the delay line set includes four delay lines with an intrinsic delay of D each, the clock signal is delayed by 4×D in order to determine the second number of delay steps. The first number of delay steps corresponding to the intrinsic delay of the delay line is computed based on the number of delay steps corresponding to the first delay and the number of delay steps corresponding to the second delay. In an embodiment, a difference between the number of delay steps corresponding to the first delay (e.g., delay steps corresponding to $\frac{1}{4}^{th}$ of the clock period) and the number of delay steps (e.g., delay steps corresponding to $\frac{1}{4}^{th}$ of the clock period–D) corresponding to the second delay is determined, and the first number of delay steps corresponding to the intrinsic delay (e.g., D) is computed based on the difference as explained herein with reference to FIG. 3 and FIG. 4. In one embodiment, a first predetermined number of delay lines (e.g., four delay lines) of the delay line set are calibrated to provide a first delay (e.g., $\frac{1}{4}^{th}$ of the clock period) through each of the plurality of delay lines. Based on the calibration, the number of delay steps configured or selected to provide the first delay through each of the plurality of delay lines is determined.

Subsequently, a second predetermined number of delay lines (e.g., a pair of delay lines) of the delay line set are calibrated to provide the second delay (e.g., ½ of the clock period) through each of the plurality of delay lines. Based on the calibration for the second delay, the number of delay steps configured or selected to provide the second delay through each of the plurality of delay lines is determined (e.g., by using control circuit 308 of FIG. 3 or control circuit 406 of FIG. 4). Furthermore, the first number of delay steps corresponding to the intrinsic delay of the delay line is determined based on the number of delay steps corresponding to the first delay, the number of delay steps corresponding to the second delay, and a ratio of the first delay and the second delay. In an embodiment, the number of delay steps corresponding to the first delay is compared (e.g., by using control circuit 308 of FIG. 3 or control circuit 406 of FIG. 4) with the number of delay steps corresponding to the second delay based on a ratio of the first delay and the second delay. The first number of delay steps corresponding to the intrinsic delay is determined based on the comparison. For example, if the first delay is $\frac{1}{4}^{th}$ of the clock period and the second delay is ½ of the clock period, in so much as ½ of the clock period=2×$\frac{1}{4}^{th}$ of the clock period, D+the number of delay steps for the second delay=2×(D+the number of delay steps for the first delay), thus implying that D=the number of delay steps for the second delay−2×the number of delay steps for the first delay, where D+the number of delay steps for the second delay corresponds to the second delay of ½ of the clock period and D+the number of delay steps for the first delay corresponds to the first delay of $\frac{1}{4}^{th}$ of the clock period.

In one embodiment, if a ratio of intrinsic delay and the fine delay steps is tightly coupled across process corners and voltage and temperature variations, the first number of delay steps are tracked to the intrinsic delay of the delay line at a process node. During tracking, the intrinsic delay is mapped as the first number of delays steps. The intrinsic delay is hard-coded as the tracked first number of delays steps. The term "hard coding" as used herein may be construed as embedding what may, perhaps in retrospect, be regarded as input or configuration data directly into a source code of a program or other executable object, or fixed formatting of the data, instead of obtaining that data from external sources or generating data or formatting in the program itself with the input.

In an embodiment, in operation 604, a second number of delay steps is determined, through the control circuit (e.g., control circuit 308 of FIG. 3 or control circuit 406 of FIG. 4) to provide a delay through the delay line based on the first number of delay steps. Consider for example where the intrinsic delay maps to 5 delay steps. Accordingly, if a 160 ps delay is to be implemented (e.g., 8 delay steps), then the second number of delay steps that are to be provided to the delay line is 3 steps (e.g., 8−5 delay steps). In an embodiment, in operation 606, the delay line is configured through a configuration circuit (e.g., configuration circuit 310 of FIG. 3 or configuration circuit 408 of FIG. 4) coupled with the delay line set for generating the delay corresponding to the second number of delay steps through the delay line. In an embodiment, the first number of delay steps corresponding to the intrinsic delay is added to a number of delay steps so as to obtain a sum. The sum is scaled based on a predetermined delay to obtain a scaled delay. The first number of delay steps corresponding to the intrinsic delay is subtracted from the scaled delay so as to obtain the number of delay steps corresponding to the predetermined delay. In an embodiment, the scaled delay is provided to a plurality of slave delay lines. Different scaling factors may be used to obtain different delays through the delay lines based on a single calibration explained earlier in operation 602.

The delay lines may be configured to provide a delay from almost zero to a selected value (e.g., a multiple of the clock period) based on the calibration, thereby enabling a granular configurability of the delay lines to be achieved by compensating for the intrinsic delay. In an embodiment, the scaled delay from the delay line is applied to a slave delay line. In an embodiment, the plurality of delays generated through each delay line using different scaling factors may be applied to a plurality of slave delay lines. Each delay line may be configured to function as a master to the plurality of slave delay lines. Various embodiments of the present technology may be used for levelization and de-skew purposes in electronic circuitry.

Figure 7:
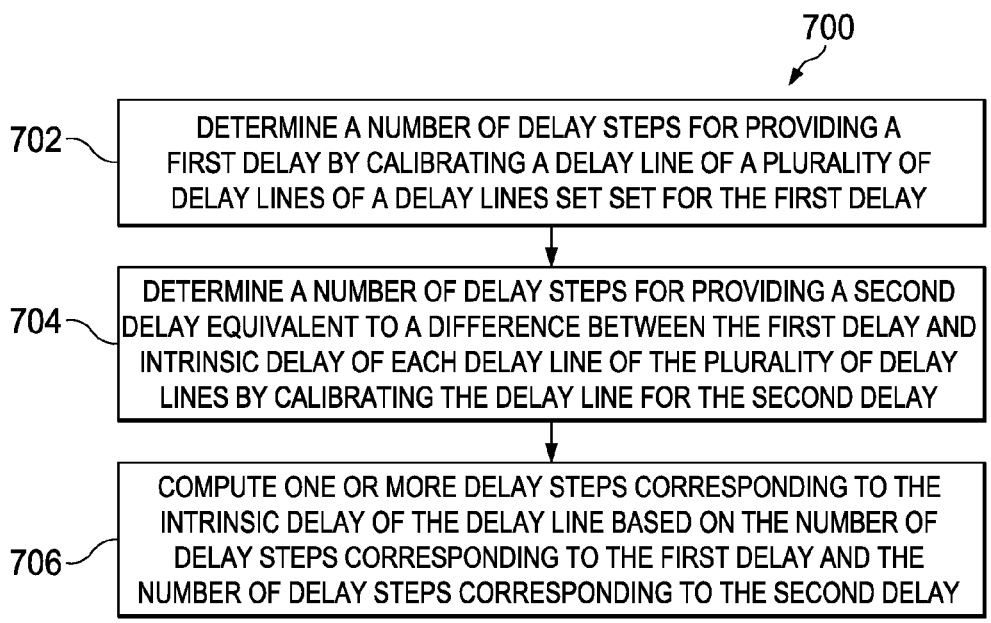
FIG. 7 is a flow chart of a first exemplary method of determining a number of delay steps corresponding to an intrinsic delay of a delay line from among a plurality of delay lines of a delay line set according to an embodiment.

FIG. 7 is a flow chart 700 of a first exemplary method of determining a first number of delay steps corresponding to an intrinsic delay of a delay line from among a plurality of delay lines of a delay line set according to an embodiment. In an embodiment, in operation 702, a number of delay steps configured or selected to provide a first delay through the delay line is determined (e.g., by using control circuit 308 of FIG. 3 or control circuit 406 of FIG. 4). The number of delay steps corresponding to the first delay is determined by calibrating (e.g., by using the delay control block 310c of FIG. 3 or the delay control block 408C of FIG. 4) the delay line for the first delay. For example, if the delay line set includes four delay lines, each delay line is calibrated to provide the first delay that is equivalent to, for example, $\frac{1}{4}^{th}$ of a clock period of a clock signal input to the delay line set. The number of delay steps to be provided to achieve the delay of $\frac{1}{4}^{th}$ of the clock period is determined based on the calibration.

In an embodiment, in operation 704, a number of delay steps configured or selected to provide a second delay equivalent to a difference between the first delay and the intrinsic delay of each delay line is determined (e.g., by using the control circuit 308 of FIG. 3 or the control circuit 406 of FIG. 4). The number of delay steps corresponding to the second delay is determined by calibrating (e.g., by using the delay control block 310c of FIG. 3 or the delay control block 408C of FIG. 4) the delay line for the second delay. During calibration, the clock signal is delayed by the intrinsic delay of the delay line. For example, if the first delay is $\frac{1}{4}^{th}$ of the clock period, and D is the intrinsic delay of each delay line, then each delay line is calibrated to provide a delay that is substantially equivalent to the difference between $\frac{1}{4}^{th}$ of the clock period and D (e.g., the second delay=$\frac{1}{4}^{th}$ of the clock period−D). In order to calibrate each of the delay lines to provide the second delay (e.g., $\frac{1}{4}^{th}$ of the clock period−D), the clock signal is delayed by the intrinsic delay of the plurality of delay lines by replicating a constant intrinsic path of the delay line to generate a delayed signal. For example, if the delay line set includes four delay lines with an intrinsic delay of D each, the clock signal is delayed by 4×D so as to generate the delayed signal. The delayed signal is subjected to phase comparison with an output signal of the delay line set so as to calibrate each of the delay lines to provide the second delay.

The number of delay steps corresponding to the second delay is determined based on the calibration.

In an embodiment, in an operation 706, the first number of delay steps corresponding to the intrinsic delay of the delay line is computed based on the number of delay steps corresponding to the first delay and the number of delay steps corresponding to the second delay. In an embodiment, a difference between the number of delay steps corresponding to the first delay (e.g., delay steps corresponding to $\frac{1}{4}^{th}$ of the clock period) and the number of delay steps corresponding to the second delay (e.g., delay steps corresponding to $\frac{1}{4}^{th}$ of the clock period−D) is determined, and the first number of delay steps corresponding to the intrinsic delay (e.g., D) are computed based on the difference as explained herein with reference to FIG. 3 and FIG. 4.

Figure 8:
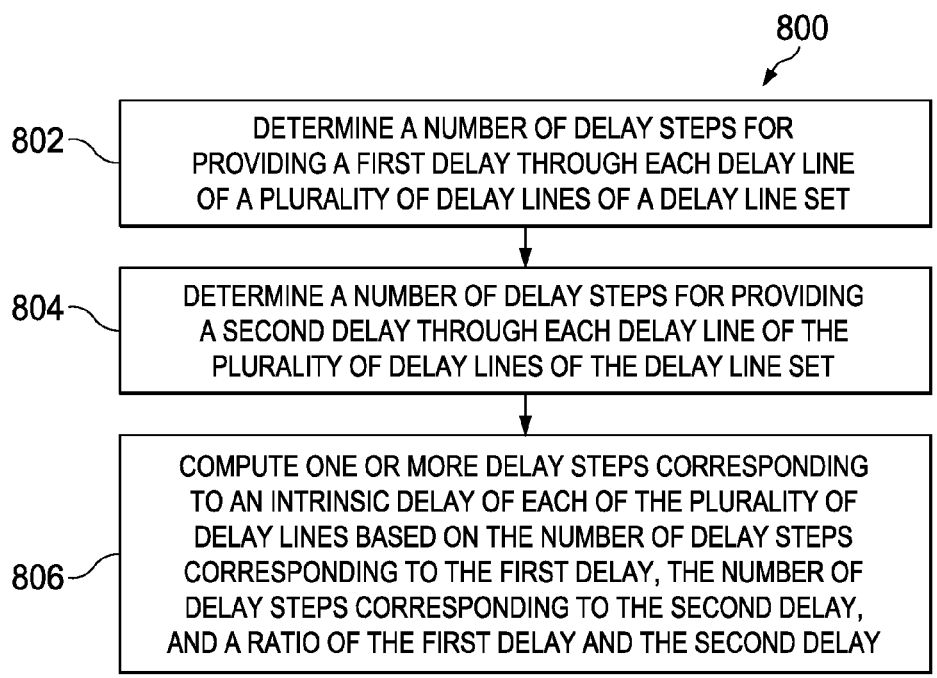
FIG. 8 is a flow chart of a second exemplary method of determining a number of delay steps corresponding to an intrinsic delay of a delay line from among a plurality of delay lines of a delay line set according to an embodiment.

FIG. 8 is a flow chart 800 of a second exemplary method of determining a first number of delay steps corresponding to an intrinsic delay of a delay line from among a plurality of delay lines of a delay line set according to an embodiment. In operation 802, a number of delay steps configured or selected to provide a first delay through each of the plurality of delay lines of the delay line set is determined. A first predetermined number of delay lines (e.g., four delay lines) of the plurality of delay lines are calibrated to provide the first delay (e.g., $\frac{1}{4}^{th}$ of the clock period) through each of the plurality of delay lines. The number of delay steps corresponding to the first delay is determined based on the calibration. In an embodiment, in operation 804, a number of delay steps configured or selected to provide a second delay through each of the plurality of delay line of the delay line set is determined (e.g., by using control circuit 308 of FIG. 3 or control circuit 406 of FIG. 4). In an embodiment, a second predetermined number of delay lines (e.g., a pair of delay lines) of the delay line set are calibrated to provide the second delay (e.g., ½ of the clock period) through each of the plurality of delay lines. The number of delay steps corresponding to the second delay is determined based on the calibration. In an embodiment, in operation 806, the first number of delay steps corresponding to the intrinsic delay of each of the plurality of delay lines is computed based on the number of delay steps corresponding to the first delay, the number of delay steps corresponding to the second delay, and a ratio of the first delay and the second delay.

In an embodiment, the number of delay steps corresponding to the first delay is compared (e.g., by using control circuit 308 of FIG. 3 or control circuit 406 of FIG. 4) with the number of delay steps corresponding to the second delay based on the ratio of the first delay and the second delay. For example, if the first delay is $\frac{1}{4}^{th}$ of the clock period and the second delay is ½ of the clock period, then ½ of clock period=2×$\frac{1}{4}^{th}$ of the clock period. If D is the intrinsic delay of each delay line, then D+the number of delay steps corresponding to ½ of the clock period=2×(D+the number of delay steps corresponding to $\frac{1}{4}^{th}$ of the clock period), thus implying that D=the number of delay steps corresponding to ½ of the clock period−2×the number of delay steps corresponding to $\frac{1}{4}^{th}$ of the clock period. The first number of delay steps corresponding to the intrinsic delay (D) are determined based on the comparison by obtaining a solution to the equation (e.g. using control circuit 308 of FIG. 3 or control circuit 406 of FIG. 4).

Figure 9:
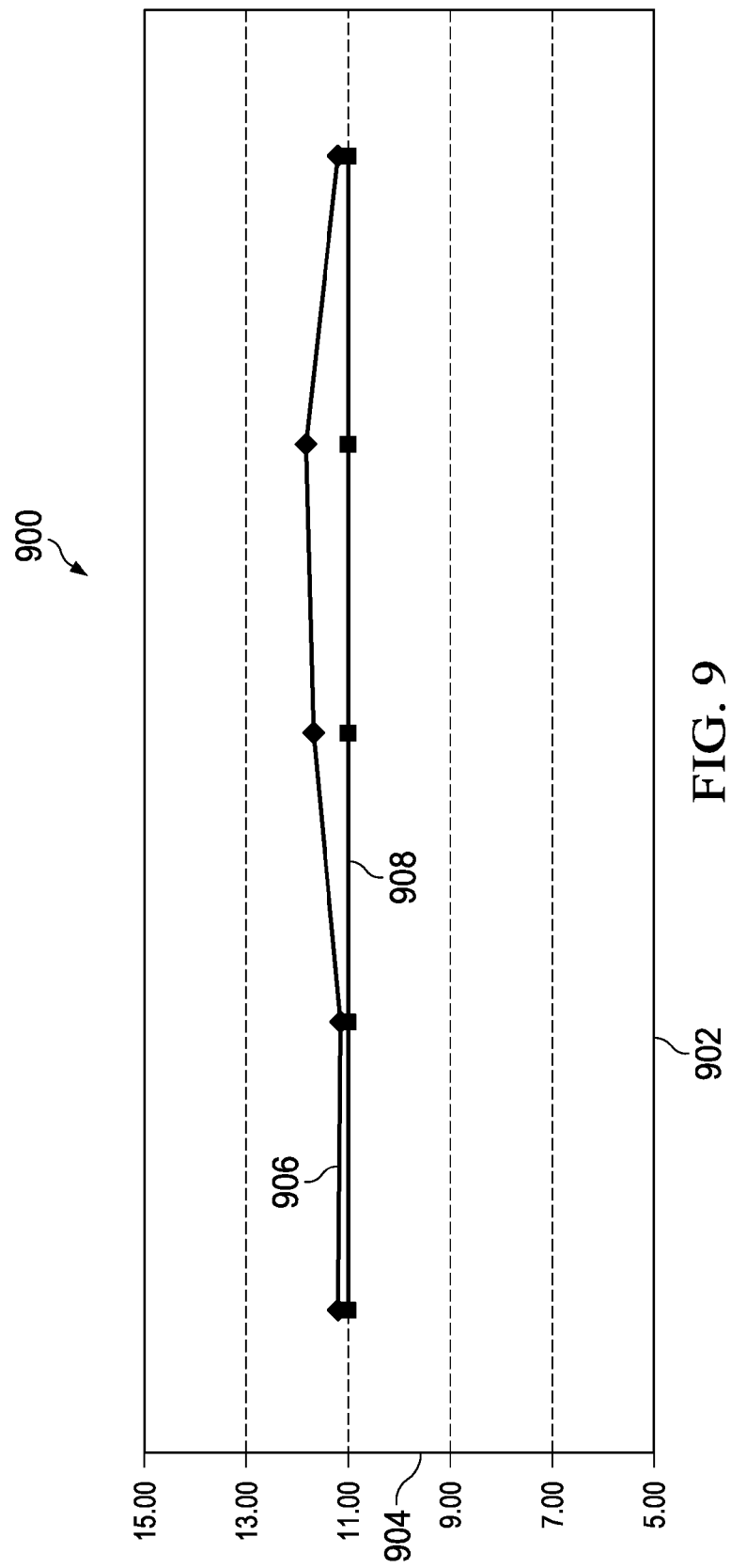
FIG. 9 is a plot illustrating an exemplary scenario of tracking a number of delay steps corresponding to an intrinsic delay of a delay line across process nodes according to an embodiment.

FIG. 9 is a plot 900 illustrating an exemplary scenario of tracking a number of delay steps corresponding to an intrinsic delay of a delay line across process nodes based on a simulation of a delay circuit (e.g., delay circuit 300 of FIG. 3 and delay circuit 400 of FIG. 4) according to embodiment. In FIG. 9, a plurality of process nodes are plotted along the X-axis 902 and a number of delay steps corresponding to a code to the delay line is plotted along the Y-axis 904. It is noted that, for purposes of illustration, the Y-axis 904 is labeled with units ranging from 5.00 to 15.00 representing the delay steps. As illustrated in FIG. 9, plot 900 includes a plot of a simulated code 906 and a code to be hard-coded 908. Upon simulation of the delay circuit, it is observed that the intrinsic delay maps to the delay steps ranging between values of 11 to 13, with values remaining close to 11 across various process nodes indicating that a ratio of the intrinsic delay and the number of delay steps corresponding to the intrinsic delay is tightly coupled across process, voltage and temperature variations. As the intrinsic delay is tracked to correspond to almost 11 delay steps across the process nodes, a value of 11 delay steps is selected as the code to be hard-coded 908. The 11 delay steps corresponding to the intrinsic delay is hard-coded into the delay line of the delay circuit.

Although the present technology has been described with reference to specific exemplary embodiments, it is noted that various modifications and changes is made to these embodiments without departing from the broad spirit and scope of the present technology. For example, the various devices, modules, analyzers, generators, etc., described herein is enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., ASIC circuitry and/or in Digital Signal Processor (DSP) circuitry) and drawings are to be regarded in an illustrative rather than a restrictive sense.

Also, the circuits described and illustrated in the various embodiments as discrete or separate is combined or integrated with other systems, modules, without departing from the scope of the present technology. Other items shown or discussed as directly coupled or communicating with each other is coupled through some interface or device, such that the items may no longer be considered directly communicatively associated or coupled with each other but may still be indirectly coupled and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

What is claimed is:

1. A method comprising:
   determining, through a control circuit coupled with a delay line set, a first number of delay steps corresponding to an intrinsic delay of a delay line from among a plurality of delay lines of the delay line set, the intrinsic delay being a minimum delay contributed by the delay line;
   determining, through the control circuit, a second number of delay steps to provide a delay through the delay line based on the first number of delay steps; and
   configuring, through a configuration circuit coupled with the delay line set, the delay line for generating the delay corresponding to the second number of delay steps through the delay line.

2. The method of claim 1, wherein determining the first number of delay steps comprises:
   determining a number of delay steps for providing a first delay by calibrating the delay line for the first delay;
   determining a number of delay steps for providing a second delay equivalent to a difference between the first delay and the intrinsic delay of each delay line, by calibrating the delay line for the second delay; and
   computing the first number of delay steps corresponding to the intrinsic delay of the delay line based on the number of delay steps corresponding to the first delay and the number of delay steps corresponding to the second delay.

3. The method of claim 2, wherein calibrating the delay line for the second delay comprises:
   delaying the clock signal by the intrinsic delay of the delay line.

4. The method of claim 2, wherein computing the first number of delay steps comprises:
   determining a difference between the number of delay steps corresponding to the first delay and the number of delay steps corresponding to the second delay; and
   determining the first number of delay steps based on the difference.

5. The method of claim 1, wherein determining the first number of delay steps comprises:
   determining a number of delay steps for providing a first delay, through each of the plurality of delay lines;
   determining a number of delay steps for providing a second delay through each of the plurality of delay lines; and
   computing the first number of delay steps corresponding to the intrinsic delay based on the number of delay steps corresponding to the first delay, the number of delay steps corresponding to the second delay, and a ratio of the first delay and the second delay.

6. The method of claim 5, wherein determining the number of delay steps corresponding to the first delay comprises:
   calibrating a first predetermined number of delay lines of the delay line set for the first delay.

7. The method of claim 5, wherein determining the number of delay steps corresponding to the second delay comprises:
   calibrating a second predetermined number of delay lines of the delay line set for the second delay.

8. The method of claim 5, wherein computing the first number of delay steps comprises:
   comparing the number of delay steps corresponding to the first delay with the number of delay steps corresponding to the second delay based on the ratio of the first delay and the second delay; and
   determining the first number of delay steps corresponding to the intrinsic delay based on the comparison.

9. The method of claim 1, wherein determining the first number of delay steps comprises:
   tracking the first number of delay steps corresponding to the intrinsic delay of the delay line at a process node; and
   hard coding the intrinsic delay as the tracked first number of delay steps.

10. The method of claim 9, wherein tracking comprises:
    mapping the intrinsic delay to the first number of delay steps.

11. The method of claim 1, further comprising:
    adding the first number of delay steps corresponding to the intrinsic delay to a number of delay steps for obtaining a sum;
    scaling the sum based on a predetermined delay to obtain a scaled delay; and
    subtracting the first number of delay steps corresponding to the intrinsic delay from the scaled delay to obtain a number of delay steps corresponding to the predetermined delay.

12. The method of claim 11, further comprising:
    providing the scaled delay to at least one slave delay line.

13. A delay circuit comprising:
    a delay line set comprising a plurality of delay lines, each of the plurality of delay lines configured to provide a plurality of delays, the delay line set comprising an input terminal configured to receive a clock signal and an output terminal;
    a constant delay block coupled with the input terminal of the delay line set, the constant delay block configured to delay the clock signal by an intrinsic delay of the plurality of delay lines;
    a control circuit coupled with the delay line set, the control circuit configured to determine a first number of delay steps corresponding to the intrinsic delay of each of the plurality of delay lines and determine a second number of delay steps based on the first number of delay steps so as to provide the plurality of delays through each of the plurality of delay lines, the intrinsic delay being a minimum delay contributed by each of the plurality of delay lines; and
    a configuration circuit coupled with the constant delay block and the delay line set, the configuration circuit configured to configure each of the plurality of delay lines to generate the plurality of delays based on the number of delay steps and thereby enable provision of the plurality of delays through each of the plurality of delay lines.

14. The delay circuit of claim 13, wherein the configuration circuit comprises:
    a selection circuit configured to provide one of the clock signal and an output of the constant delay block as an output of the selection circuit;
    a phase comparator coupled with the selection circuit and the output terminal of the delay line set and configured to determine a phase difference between the output of the selection circuit and the output of the delay line set; and
    a delay control block coupled with the delay line set and the phase comparator, configured to control the delay generated through the each of the plurality of delay lines based on the phase difference.

15. The delay circuit of claim 13, the control circuit comprising:
a scaling circuit configured to scale each of the plurality of delays generated through each of the plurality of delay lines and to provide the scaled delays to a plurality of slave delay lines.

16. The delay circuit of claim 13, wherein the control circuit is further configured to:
determine a number of delay steps for providing a first delay through each of the plurality of delay lines;
determine a number of delay steps for providing a second delay equivalent to a difference between the first delay and the intrinsic delay of each of the plurality of delay lines through each of the plurality of delay lines; and
compute the first number of delay steps corresponding to the intrinsic delay of each delay line based on the number of delay steps corresponding to the first delay and the number of delay steps corresponding to the second delay.

17. A delay circuit comprising:
a delay line set comprising a plurality of delay lines, each of the plurality of delay lines configured to provide a plurality of delays, the delay line set comprising an input terminal configured to receive a clock signal and an output terminal configured to provide a delayed signal;
a control circuit coupled with the delay line set, the control circuit configured to determine the first number of delay steps corresponding to an intrinsic delay of the delay line set and determine the second number of delay steps based on the first number of delay steps so as to provide the plurality of delays through each of the plurality of delay lines, the intrinsic delay being a minimum delay contributed by each of the plurality of delay lines; and
a configuration circuit coupled with the delay line set, the configuration circuit configured to configure each of the plurality of delay lines to generate the plurality of delays based on the second number of steps and thereby enable provision of the plurality of delays through each of the plurality of delay lines.

18. The delay circuit of claim 17, wherein the configuration circuit comprises:
a selection circuit coupled with the delay line set configured to provide one of the delayed signal from the output terminal of the delay line set and a signal output from a portion of the delay line set comprising one or more delay lines as an output of the selection circuit;
a phase comparator coupled with the selection circuit and configured to determine a phase difference between the output of the selection circuit and the clock signal; and
a delay control block coupled with the delay line set and the phase comparator for controlling the delay generated through the each of the plurality of delay lines based on the phase difference.

19. The delay circuit of claim 17, wherein the control circuit comprises:
a scaling circuit configured to scale each of the plurality of delays generated through each of the plurality of delay lines and provide the scaled delay to a plurality of slave delay lines.

20. The delay circuit of claim 17, wherein the control circuit is further configured to:
determine a number of delay steps for providing a first delay, through the delay line;
determine a number of delay steps for providing a second delay through the delay line; and
determine the first number of delay steps corresponding to the intrinsic delay based on the number of delay steps corresponding to the first delay, the number of delay steps corresponding to the second delay and a ratio of the first delay and the second delay.

* * * * *